US009858796B2

United States Patent
Ricciuti

(10) Patent No.: US 9,858,796 B2
(45) Date of Patent: Jan. 2, 2018

(54) MOUNTABLE WALL RECEPTACLES INCLUDING CURRENT SENSING AND ADDRESSABLE IDENTIFICATION AND MONITORING FUNCTIONALITIES VIA POWER-LINE COMMUNICATION

(71) Applicant: EATON CORPORATION, Cleveland, OH (US)

(72) Inventor: Anthony Thomas Ricciuti, Bethel Park, PA (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/988,392

(22) Filed: Jan. 5, 2016

(65) Prior Publication Data

US 2017/0193793 A1 Jul. 6, 2017

(51) Int. Cl.
*G08B 21/18* (2006.01)
*G01R 15/18* (2006.01)
*G01R 15/20* (2006.01)
*G01R 19/00* (2006.01)
*H01R 13/66* (2006.01)
*H01R 24/76* (2011.01)

(52) U.S. Cl.
CPC .......... *G08B 21/182* (2013.01); *G01R 15/18* (2013.01); *G01R 15/202* (2013.01); *G01R 19/0092* (2013.01); *H01R 13/6683* (2013.01); *H01R 13/6691* (2013.01); *H01R 24/76* (2013.01)

(58) Field of Classification Search
CPC . H02J 13/0013; H02J 13/002; Y02B 90/2615; Y04S 20/40; G08B 21/182; G05B 23/0221; G01R 19/0092
See application file for complete search history.

(56) References Cited

U.S. PATENT DOCUMENTS

| | | | |
|---|---|---|---|
| 2003/0050737 A1* | 3/2003 | Osann, Jr. | G05B 15/02 700/276 |
| 2010/0090542 A1* | 4/2010 | Johnson | H02G 3/00 307/125 |
| 2013/0046412 A1* | 2/2013 | Chan | G01D 4/004 700/286 |

* cited by examiner

*Primary Examiner* — Curtis Odom
(74) *Attorney, Agent, or Firm* — Eckert Seamans; Michael Jones; Grant Coffield

(57) ABSTRACT

A mountable wall receptacle including one or more current sensors and power-line communications circuitry is described herein. In one exemplary, non-limiting embodiment, the mountable wall receptacle includes power-line communications circuitry, one or more current sensors, a power source, and one or more internal contacts. The wall receptacle is capable of monitoring and recording, using the current sensor(s), an amount of current or energy provided to an accessory device plugged into one or more outlets in communication with the one or more internal contacts. A user device is able to obtain the recorded amount of current or energy from various access points within a residence using one or more power lines located at the residence. The power lines enable the user device to communicate with the wall receptacle using the power-line communications circuitry therein.

5 Claims, 3 Drawing Sheets

MOUNTABLE WALL RECEPTACLES INCLUDING CURRENT SENSING AND ADDRESSABLE IDENTIFICATION AND MONITORING FUNCTIONALITIES VIA POWER-LINE COMMUNICATION

BACKGROUND

Field

The disclosed concept relates generally to mountable wall receptacles (e.g., outlets) including current sensing functionality, where such wall receptacles are capable of being addressed and monitored using power-line communications.

Background Information

Many common household devices require energy, typically in the form of an applied alternating current ("AC") or direct current ("DC"), to function. One mechanism for providing energy to these types of appliances is by using a wall outlet. Wall outlets, power plugs, or sockets, as commonly referred, are access points that allow devices, such as those that require energy to operate, to be electrically connected to a primary AC power supply of a building. An individual, for example, plugs the device into the wall outlet, thereby allowing energy, such as AC power, to be transmitted to the device from the building's power supply. The building's power supply, in turn, receives electrical power from one or more power stations, which provide power to the building using one or more power-lines forming a power transmission/distribution network. For multi-tenant dwellings, such as apartment buildings or split-level homes, the building's power-line infrastructure enables each unit within the building receive power from the building's main power supply.

However, there is a monetary cost, as well as an environmental cost, associated with the amount of energy that is consumed by each household. Typically, the amount of energy is tracked by a local power company who operates the one or more power stations. The power company sets a cost, or price, for each unit of energy that will be consumed, as well as calculates a total amount of energy consumed by each household. Based on this criteria, a total energy cost for each household is determined by the power company.

As the cost of utilities, such as power, continue to increase, it is becoming increasingly important for individuals/families to better self-monitor the amount of energy that they consume. This, unfortunately, can be difficult as many older households or multi-tenant dwellings are not well structured to accurately monitor and/or calculate the amount of energy used. This is particularly true for multi-tenant dwellings (e.g., apartment buildings), as the electrical usage of each individual household (e.g., apartment) can be difficult to accurately quantify.

There are few mechanisms to combat such issues, and each has various drawbacks associated therewith. For example, individuals may, themselves, track an energy meter for their household to monitor energy consumption. However, the energy meter may be inconveniently located, such as in a basement, and/or may be poorly calibrated. As another example, individual energy trackers may be purchased that enable an individual to calculate an amount of energy used by a particular wall receptacle by connecting the tracker to the wall receptacle, or to a device connected to the wall receptacle, and then performing an energy reading. However, this requires the tracker to be connected to the outlet while in use, therefore only working when the tracker is connected.

There is, therefore, room for improvement in mountable wall receptacles, such as household outlets, and other energy providing endpoints.

SUMMARY

These needs and others are met by embodiments of the disclosed concept, which are directed to mountable wall receptacles including current sensing and addressable identification and monitoring functionalities through power-line communication.

As one aspect of the disclosed concept, a current sensing device is provided for a mountable wall receptacle. The current sensing device includes an internal contact, a current sensor, a power source, and power-line communications circuitry. The internal contact is for an outlet, where a plug for an accessory device is received by the outlet such that the internal contact is in electrical communication with the accessory device. The current sensor is coupled to the internal contact such that it monitors an amount of energy provided to the internal contact for the accessory device. The power source is coupled to the current sensor and to the internal contact, and is operable to provide energy to the accessory device. The power-line communications circuitry is in electrical communication with at least the current sensor.

As another aspect of the disclosed concept, a mountable wall receptacle is provided that monitors energy output. The mountable wall receptacle includes a cover plate, an upper mount, a lower mount, a housing, and a current sensing device. The cover plate includes one or more sets of openings for an outlet. The upper mount is located at an upper portion of the cover plate for securing the wall receptacle to a wall, and the lower mount is located at a lower portion of the cover plate for further securing the wall receptacle to the wall. The housing is coupled to an inner portion of the cover plate such that the housing is received within an opening of the wall. The current sensing device is stored within the housing and includes an internal contact for the outlet, a current sensor, a power source, and power-line communications circuitry. The internal contact for the outlet is structured such that a plug for an accessory device is received by the outlet such that the internal contact is in electrical communication with the accessory device. The current sensor is coupled to the internal contact such that it monitors an amount of energy provided to the internal contact for the accessory device. The power source is coupled to the current sensor and the internal contact, and is operable to provide energy to the accessory device. Furthermore, the power-line communications circuitry is in electrical communication with at least the current sensor.

As yet another aspect of the disclosed concept, a system is provided for using power-lines to monitor energy output for a wall receptacle. The system includes one or more power-lines, a user device, and a wall receptacle. The user device includes a power-line communications interface and is coupled to the one or more power-lines. The wall receptacle is also coupled to the one or more power-lines such that the wall receptacle and the user device are in communication with one another. The wall receptacle includes a current sensing device. The current sensing device includes an internal contact for an outlet, a current sensor, a power source, and power-line communications circuitry. The internal contact is structured such that a plug for an accessory device is received by the outlet such that the internal contact is in electrical communication with the accessory device. The current sensor is coupled to the internal contact such that it monitors an amount of energy provided to the internal contact for the accessory device. The power source is coupled to the current sensor and the internal contact, and is operable to provide energy to the accessory device. The power-line communications circuitry is in electrical communication with, at least, the current sensor.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
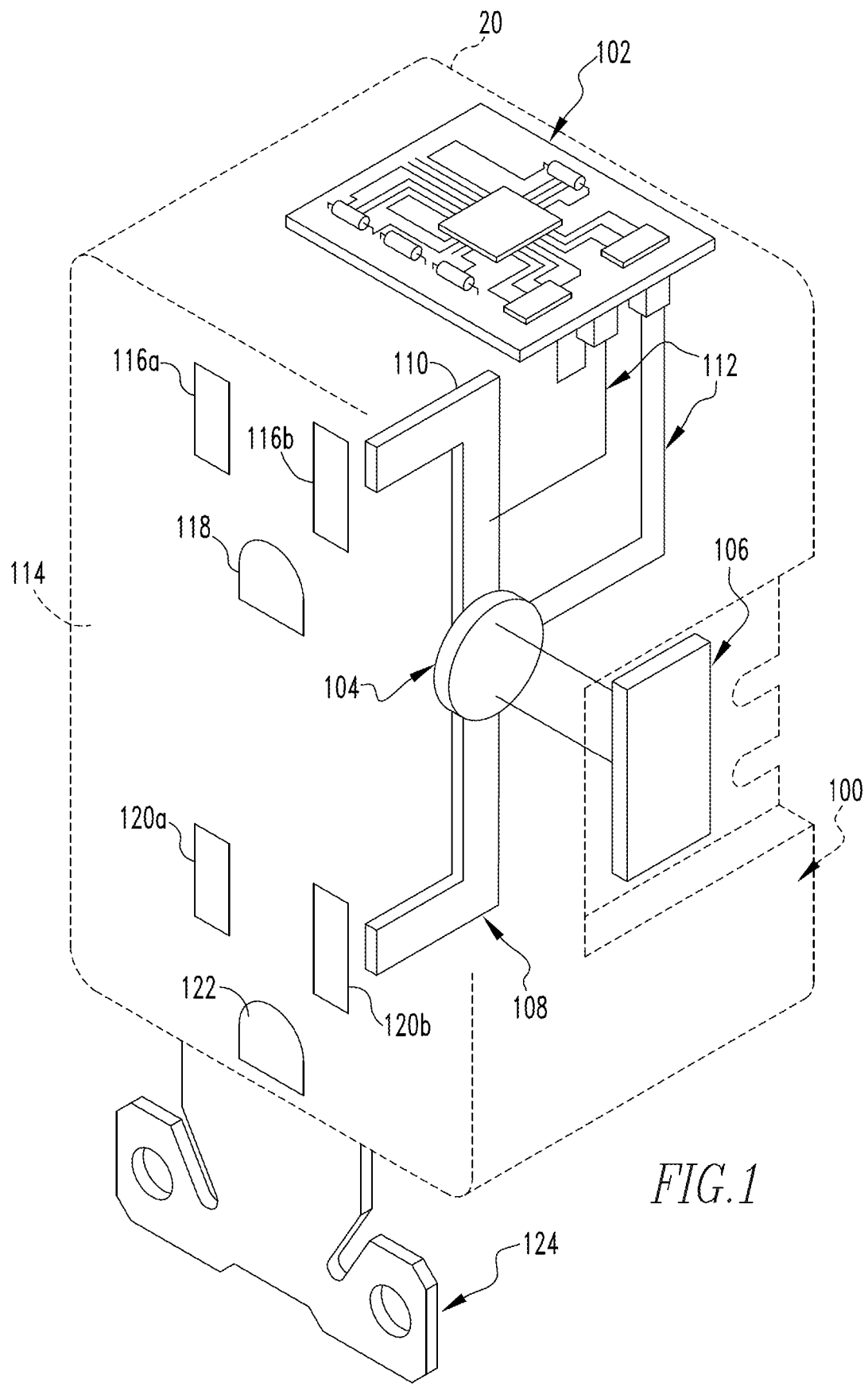
FIG. 1 is an illustrative schematic diagram of a cut-away view of a portion of a mountable wall receptacle in accordance with an embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "accessory device" refers to any known or suitable component or feature capable of receiving power from an outlet in order to perform one or more functions.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the statement that two or more parts are "electrically coupled" or are in "electrical communication" shall mean that two or more the parts or components are joined together either directly or joined through one or more intermediate parts such that electricity, current, voltage, and/or energy is operable to flow from one part or component to the other part or component, and vice versa.

As employed herein, the terms "household," "residence," and/or "dwelling" refer to a structure where one or more individuals may live or work.

Power-line communication ("PLC") enables two or more access points to communicate both data as well as AC power with one another. Individuals are capable of communicating with different regions of their household using their household's internal power-line network. These power-line networks are stable communication lines that are present within most households or residences, and provide power to individual outlets, or wall receptacles, within the household from a main power source, such as a power distribution center or energy center. Using such power-lines within one's household enables individual to communicate data between various access points within the household, which are connected to one another by the household's power-line network. Therefore, accessory devices plugged into one outlet in one location of the residence are capable of being communicated with via another outlet located at another location of the residence.

FIG. 1 is an illustrative schematic diagram of a cut-away view of a portion of a mountable wall receptacle 2 in accordance with an embodiment of the disclosed concept. Wall receptacle 2 includes a housing 20 for a current sensing device 100 located therein. Housing 20 is structured such that it is received within an opening in a wall, such as where one or more wall outlets may be located. Housing structure 20, in one embodiment, is substantially box shaped such that current sensing device 100 is capable of being stored within an inner cavity thereof. In one embodiment, a wall of a residence already has wall receptacle 2 installed therein such that an individual need not perform any installation. However, wall receptacle 2 is also capable of being installed within an individual's home by replacing any pre-existing wall receptacle with wall receptacle 2. Wall receptacle 2 further includes, along an outer portion of housing 20, a cover plate 114, which is structured such that, when wall receptacle 2 is installed, only cover plate 114 is visible. Housing 20, and therefore current sensing device 100, is located within the opening in the wall of the residence.

When wall receptacle 2 is to be installed, receptacle mounts, such as a lower receptacle mount 124, are used to secure wall receptacle 2 to the wall within which wall receptacle 2 will reside. Lower receptacle mount 124, located at a lower end of cover plate 114, mechanically couples wall receptacle 2 to a corresponding wall that wall receptacle 2 is to be mounted within. An upper receptacle mount, although not shown, would be located at an upper end of cover plate 114, and may also be used to similarly mechanically couple wall receptacle 2 to the corresponding wall.

As mentioned above, current sensing device 100 is located and stored within housing 20. In one exemplary embodiment, housing 20 is substantially box shaped, however other configurations for housing 20 are possible. Persons of ordinary skill in the art will also recognize that housing 20 is capable of storing current sensing device 100, however in at least one embodiment, one or more portions of current sensing device 100, such as a coupling to ground, may be located outside of, or may extend past the boundaries of, housing 20. Furthermore, although cover plate 114, in the exemplary embodiment, is shown to be substantially rectangular, other configurations of cover plate 114 are also possible. Still further, cover plate 114 is removable such that alternate cover plates can be used instead.

Current sensing device 100, in the exemplary embodiment, includes one or more internal contacts 108, 110. Internal contacts 108 and 110 each correspond to an outlet that a plug for an accessory device may be plugged into. Each outlet, therefore, includes an opening 116a, 116b, 118, or 120a, 120b, 122, where the plug for the accessory device is received. Internal contacts 108, in the illustrative embodiment, electrically couple to a plug of a device received within openings 120a, 120b, and 122, while internal contacts 110 electrically couple to a plug for a device received within openings 116a, 116b, and 118. For example, openings 116a, 116b, 118 and/or openings 120a, 120b, 122 are configured such that they receive prongs for an external device that is to receive electrical power from wall receptacle 2. Internal contacts 108, 110 therefore, are in electrical communication with the device's prongs that are inserted within openings 116a, 116b, 118, and/or openings 120a, 120b, 122, such that the external device is provided with power from a power source 106 via internal contacts 108, 110.

In one embodiment, internal contacts 108, 110 are formed out of a conductive material, such as copper, however any suitable material for communicating electricity thereby may be used. Power source 106, for example, may correspond to a 120 Volt alternating current ("AC") terminal, however persons of ordinary skill in the art will recognize that any power source, or type of power, may be used, and the aforementioned is merely exemplary. For example, power source 106 may alternatively correspond to a DC power terminal, or a power terminal capable of providing power of any other magnitude.

In the exemplary embodiment, openings 116a, 116b, and 120a, 120b correspond to contact portions for a plug of an accessory device to receive power from wall receptacle 2. Openings 118 and 122, however, within cover plate 114 correspond to ground portions for the plug of the accessory device, for inputting to a grounding source. Some external devices that require power to operate include a grounding prong. This grounding prong is received, when the external device is plugged into wall receptacle 2, by either opening 118 or opening 122, depending on the outlet that the plug of the accessory device is plugged into. For example, internal contact 110 may be in communication with opening 118, which may be coupled to a grounding source already present within a wall where wall receptacle 2 is mounted. By additionally coupling to ground, unwanted noise within any electrical signals, such as those being communicated from power-line control circuitry 102 to a corresponding device operating the power-line communications interface, is minimized.

Coupled to, and in electrical communication with, both of internal contacts 108, 110 and power source 106, in the exemplary embodiment is a current sensor 104. Current sensor 104 corresponds to any suitable device or circuitry that is capable of measuring an amount of current, or energy, being provided to either of internal contacts 108 and/or 110, and therefore any accessory device coupled thereto, from power source 106. Current sensor 104 may, for example, correspond to a Hall Effect sensor and/or a current transformer, however any other suitable current measuring device may additionally, or alternatively, be used. Furthermore, although only one instance of current sensor 104 is present with mountable wall receptacle 2, persons of ordinary skill in the art will recognize that wall receptacle 2 may include any suitable number of current sensors, and the use of a single current sensor 104 is merely exemplary. For example, wall receptacle 2 may include a Hall Effect sensor and a current transformer, two Hall Effects sensors, or any other type of current sensor, or any combination thereof.

Current sensor 104 is capable of monitoring, tracking, and/or recording an amount of current, or energy, provided to either of internal contacts 108, 110. In one embodiment, current sensor 104 provides the amount of current detected thereby to one or more storage mediums, which are described in greater detail below. In one embodiment, current sensor 104 measures the amount of current provided to internal contacts 108, 110. The amount of current corresponds to the amount of current, or power consumption, of the accessory device coupled thereto. For example, power source 106 may provide the accessory device plugged into a respective outlet coupled to either of internal contacts 108 or 110 with voltage (e.g., the power is turned on), and current sensor 104 may measure the amount of current passing from power source 108 to internal contact 108 or 110. Furthermore, current sensor 104 is also capable of measuring a total amount of current, or energy, provided to either of internal contacts 108 or 110 for various periods of time. For example, an amount of current provided to internal contact 110 over a thirty day time interval may be tracked by current sensor 104, so that an individual monitor an amount of power consumed by an accessory device plugged into an outlet corresponding to internal contact 110.

Wall receptacle 2, in the illustrated exemplary embodiment, also includes a power-line control circuitry 102, located within housing 20. Power-line control circuitry 102 is coupled to internal contacts 108, 110, as well as current sensor 104 and power source 106, via one or more leads 112. In the exemplary embodiment, power-line control circuitry 102 is configured such that it communicates with one or more power-lines already present within the residence where wall receptacle 2 is installed. In this way, wall receptacle 2, and in particular current sensor 104, can be accessed by any other access point with the residence using a power-line communication interface in communication with power-line control circuitry 102. As an illustrative example, a reading of an amount of current, energy, or power, provided from power source 106 to an accessory device plugged into wall receptacle 2 is obtainable by accessing wall receptacle 2 via power-line control circuitry 102. The amount of energy/current is retrieved from current sensor 104, and transmitted to the power-line communications interface via power-line control circuitry 102.

In one embodiment, wall receptacle 2—and/or any other similar wall receptacle located within the residence or building where wall receptacle 2 is installed—has a unique identifier associated with it. The unique identifier is an address that allows an individual to communicate with wall receptacle 2 using an appropriate power-line communications interface to access wall receptacle 2. For example, wall receptacle 2 may have an identifier of MWR-1234. In this particular scenario, a user device including a power-line communications interface, may access wall receptacle 2 using identifier MWR-1234, to thereby communicate with wall receptacle 2 over one or more pre-existing power-lines. For example, wall receptacle 2 may be located in a basement of a residence, while a user device is located in an attic. The user device may use the identifier of power-line communications circuitry 102 to communicate directly with wall receptacle 2, to obtain data corresponding to an amount of current provided to an accessory device coupled to wall receptacle 2.

Figure 2:
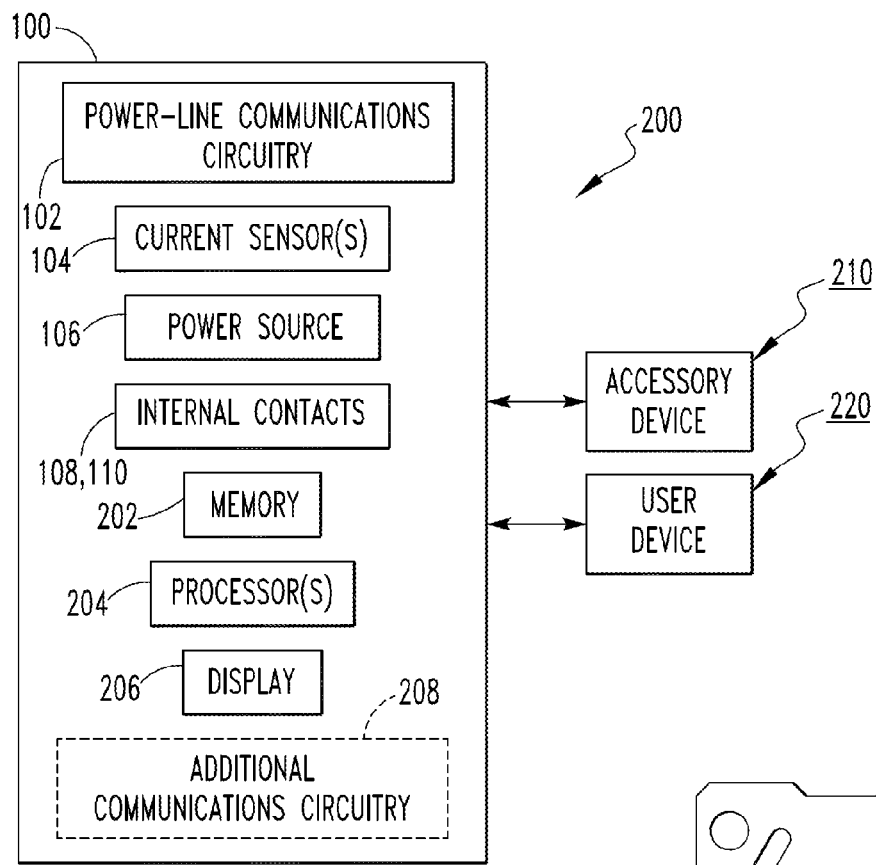
FIG. 2 is an illustrative block diagram of a system for using the mountable wall receptacle of FIG. 1 to couple an accessory device and a user device together, in accordance with an embodiment of the disclosed concept.

FIG. 2 is an illustrative block diagram of a system including the mountable wall receptacle of FIG. 1 in communication with an accessory device and a user device together, in accordance with an embodiment of the disclosed concept. A system 200 of FIG. 2 includes, in the exemplary, non-limiting embodiment, current sensing device 100, an accessory device 210, and a user device 220. Current sensing device 100, as described above, is housed within housing 20 of mountable wall receptacle 2. Accessory device 210 corresponds to any suitable device that is capable of being plugged into one or more outlets of wall receptacle 2 (e.g., within openings 116a, 116b, 118, or 120a, 120b, 122) in order to receive power to operate. Various types of accessory devices include, but are not limited to, vacuums, lamps or other illuminating sources, hand held accessories, air-conditioners, fans, multimedia devices, televisions, wireless communications hubs, and/or extension cords coupled to other devices.

User device 220 corresponds, for instance, to any suitable device that is operable to communicate with current sensing device 100 of wall receptacle 2 using any suitable communications means. For example, user device 220 may communicate with current sensing device 100 using a power-line communications interface resident on user device 220 in communication with power-line communications circuitry 102 of current sensing device 100. The power-line communications interface corresponds, in one embodiment, to any suitable software, hardware, or logic that is used to enable user device 220 to communicate with one or more power-lines. User device 220, in another embodiment, is also capable of communicating with any other device using any suitable communications protocol, including, but not limited to, Wi-Fi (e.g., 802.11 protocol), Bluetooth®, radio frequency systems (e.g., 900 MHz, 1.4 GHz, and 5.6 GHz communication systems), cellular networks (e.g., GSM, AMPS, GPRS, CDMA, EV-DO, EDGE, 3GSM, DECT, IS-136/TDMA, iDen, LTE or any other suitable cellular network protocol), infrared, BitTorrent, FTP, RTP, RTSP, SSH, and/or VOIP. User device 220 also is configured to include an antenna to facilitate wireless communications with a network using various wireless technologies (e.g., Wi-Fi, Bluetooth®, radiofrequency, etc.), as well as one or more universal serial bus ("USB") ports, one or more Ethernet or broadband ports, and/or any other type of hardwire access port, or any combination thereof.

Current sensing device 100, as described previously, includes power-line communications circuitry 102, current sensor(s) 104, power source 106, and internal contacts 108 and 110. In the illustrative, non-limiting embodiment, current sensing device 100 also includes a memory 202, one or more processors 204, a display 206, and an additional communication circuitry 208. Additional communication circuitry 208 is an optional component that allows current sensing device 100 to communicate with user device 220, or any other device, using any of the aforementioned communications protocols in addition to, or instead of, power-line communications circuitry 102. For example, additional communications circuitry 208 may enable current sensing device 100 to communicate with user device 220 using Wi-Fi (e.g., 802.11 protocol).

Memory 202, in the exemplary embodiment, corresponds to any suitable storage medium, such as any volatile or non-volatile memory, or any removable or non-removable memory capable of storing data, such as current/energy readings monitored by current sensor 104, on current sensing device 100. Various types of memory include, but are not limited to, hard drives, solid state drives, flash memory, permanent memory (e.g., ROM), electronically erasable programmable read-only memory ("EEPROM"), CD-ROM, digital versatile disk ("DVD") or other optical storage medium, magnetic cassettes, magnetic tape, magnetic disk storage or other magnetic storage devices, RAID storage systems, or any other storage type, or any combination thereof. Furthermore, memory 202 is configured such that computer-readable storage media ("CRSM") is also stored therein, which corresponds to any available physical media accessible by processor(s) 204 to execute one or more instructions stored within memory 202. For example, current sensor 104 may monitor an amount of current provided to internal contacts 108, 110, and the amount of current may be stored on current sensing device 100 within memory 202. In this way, the current readings are retrievable from memory so that they may be analyzed or reviewed, for example.

Processor(s) 204, in the exemplary embodiment, correspond to any suitable processing circuitry capable of controlling operations and/or functionality of current sensing device 100, as well as facilitating communications between various components within current sensing device 100. Various types of processors include, but are not limited to, central processing units ("CPU"), graphic processing units ("GPU"), microprocessors, digital signal processors, or any other type of processor, or any combination thereof. Furthermore, processor(s) 204 is structured such that the functionality is performed by any suitable hardware logic components including, but not limited to, field-programmable gate arrays ("FPGA"), application specific integrated circuits ("ASICs"), application-specific standard products ("ASSPs"), system-on-chip systems ("SOCs"), and/or complex programmable logic devices ("CPLDs"). Furthermore, processor(s) 204, in one embodiment, includes its own local memory for storing one or more program modules, program data, and/or operating systems.

In one exemplary embodiment, current sensing device 100 also includes one or more instances of display 206 located on cover plate 114, as seen in greater detail below with reference to FIG. 3. Display 206 is structured such that any suitable output interface is capable of being used including, but not limited to, liquid crystal displays ("LCD"), monochrome displays, color graphics adapter ("CGA") displays, enhanced graphics adapter ("EGA") displays, variable graphics array ("VGA") display, touch screens, or any other type of display, or any combination thereof. Still further, display 206, in another embodiment, is a touch screen. For example, display 206 may include capacitive sensing panels capable of recognizing touch inputs thereon. Display 206, generally, is capable of displaying the amount of current or energy provided to either outlet of wall receptacle 2. In one embodiment, display 206 displays an output reading stored in memory 202 corresponding to an amount of current provided by wall receptacle 2, as measured by current sensor 104. In another embodiment, display 206 displays a readable output of the amount of current, which is converting from a binary format to a readable format via conversion instructions stored within memory 202. For example, the amount of current provided to a plug of accessory device 210 may be recorded in binary format. Processor(s) 204 may convert the binary reading into a unit that an individual can more easily read (e.g., a currency or kW/hrs), using one or more conversion steps stored within memory 202. This readable value is than provided to display 206 so that the individual is aware of an amount of current that has been provided to accessory device 210 during operation.

Figure 3:
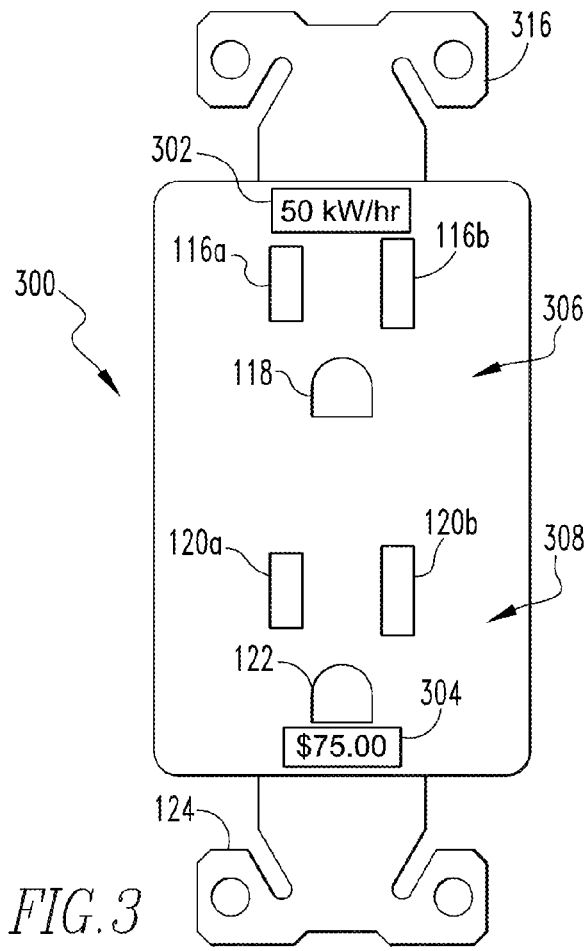
FIG. 3 is an illustrative schematic diagrams of a front view of the mountable wall receptacle of FIG. 1, in accordance with another embodiment of the disclosed concept.

FIG. 3 is an illustrative schematic of a front view of a mountable wall receptacle in accordance with another embodiment of the disclosed concept. As shown in front view 300, cover plate 114, in one exemplary embodiment, includes a first display screen 302 and a second display screen 304. First display screen 302 corresponds to a first outlet 306 of wall receptacle 2, whereas second display screen 304 corresponds to a second outlet 308 of wall receptacle 2.

In one embodiment, a plug of accessory device 210 received within openings 116a, 116b, and 118 of outlet 306 receives power (e.g., current) from power source 106 via internal contacts 110. Power provided to internal contacts 110 is also monitored and tracked by current sensor 104 such that an amount of current, for example, that is provided to internal contacts 110 for the accessory device plugged into outlet 306 is tracked by current sensor 104. The amount of current, when read by current sensor 104, in one embodiment, is of a first data format, such as binary format. Binary format (e.g., a system of ones (e.g., "1") and zeros (e.g., "0")) represents numerical values using two different symbols. For example, the number one is represented in binary format as "1," the number two is represented in binary format as "10," and the number three is represented in binary format as "11." In the illustrative example, display 302 may be structured such that it displays the amount of current read by current sensor 104 in binary format.

In another embodiment, however, the binary format reading of current sensor 104 is converted into another, potentially more readable, format using conversion rules stored within memory 202 for current sensor 104. For example, memory 202 may include instructions that converts the initial reading from current sensor 104 into a more user-friendly output, such as kiloWatts per hour (e.g., "kW/hrs") or into monetary values (e.g., dollars ("$"), Euros ("€"), etc.). As seen in the illustrative embodiment, first display screen 302 presents a reading from current sensor 104 for first outlet 306 in kW/hrs (e.g., "50 kW/hrs"). This corresponds to a device (e.g., accessory device 210) that is plugged into outlet 306, which consumes 50 kW/hrs of energy for a given period of time. Furthermore, second display screen 304 presents a reading from current sensor 104 for second outlet 308 in dollars (e.g., "$75.00"). This corresponds to another device (e.g., accessory device 210) that instead is plugged into outlet 308, and which consumes $75.00 of energy for a given period of time.

In one embodiment, the output presented on either first display 302 or second display 304 corresponds to a total or cumulative value of an amount of energy consumed by the device plugged into a respective outlet. For example, the displayed reading on second display 304 corresponds to a total amount of energy provided to a device plugged into outlet 308 during a current billing cycle. However, the displayed readings alternatively may correspond to individual sessions when an accessory device, plugged into that display screen's outlet, is being used. In another embodiment, a reset button or reset instruction is also provided with wall receptacle 2 to reset the displayed output to a new value based on a new time period of reading from current sensor 104.

Figure 4:
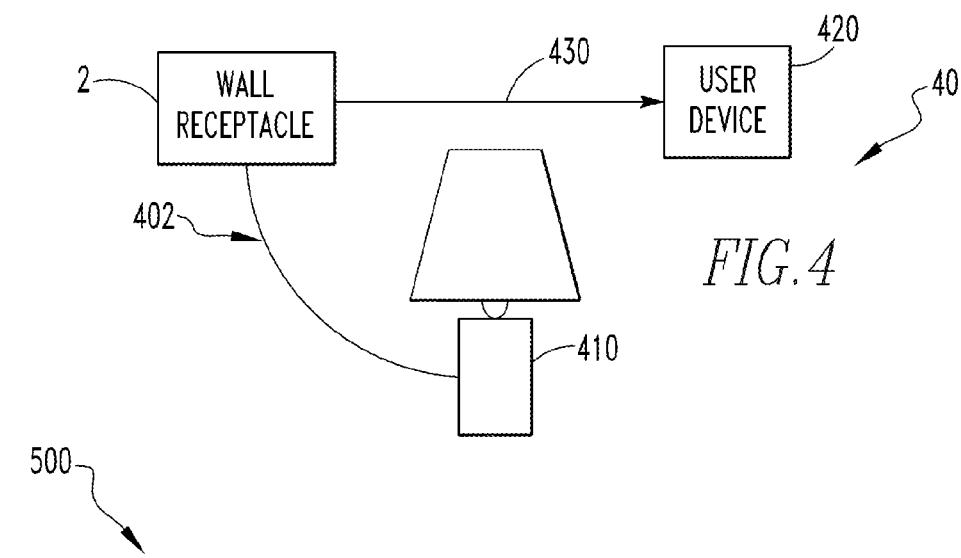
FIG. 4 is an illustrative block diagram of a system for using the mountable wall receptacle of FIG. 1 to monitor energy of an accessory device via a user device, in accordance with another embodiment of the disclosed concept.

FIG. 4 is an illustrative block diagram of a system for using the mountable wall receptacle of FIGS. 1 and 3 to monitor energy of an external device via a user device, in accordance with another embodiment of the disclosed concept. System 400 includes an accessory device 410, which is plugged into one of outlets 306 and 308 of wall receptacle 2 via a plug 402. For example, accessory device 410 may correspond to a lamp, or any other external device that operates via power received from an outlet, such as outlets 306, 308 of wall receptacle 2. Persons of ordinary skill in the art will recognize that plug 402, in one embodiment, includes an extension portion such that the actual plug (e.g., contacts received within openings 116a, 116b, 118 or 120a, 120b, 122) is inserted within either of outlets 306 or 308, and the extension portion extends from the plug to accessory device 410, and the aforementioned description of plug 402 is merely exemplary.

User device 420, which in one exemplary embodiment is substantially similar to user device 220 of FIG. 2, communicates with wall receptacle 2 via one or more power-lines 430. User device 420 is capable of having a power-line communications interface such that user device can access power-line communications circuitry 102 of wall receptacle 2 using power-lines 430. As mentioned above, many residences or buildings are structured such that they include multiple instances of power-lines 430, which in turn may communicate with an external power transformer and/or various wall receptacles 2 within the residence/building. User device 420 is capable of connecting with wall receptacle 2 by first determining an address, or identifier, of wall receptacle 2, and then using that address or identifier communicate directly with wall receptacle 2 over power-lines 430.

In one embodiment, user device 420 is capable of obtaining current or energy readings from current sensor 104 using power-lines 430. For example, wall receptacle 2 is configured to monitor and record an amount of current provided to a device, such as accessory device 410, that is plugged into one of outlets 306 and 308. User device 420 is, therefore, able to retrieve the recorded amounts of current from wall receptacle 2 by accessing wall receptacle 2 using power-line communications circuitry 102. In this way, an individual is able to monitor an amount of energy used by various products to better tracker their energy consumption, in an attempt to reduce their energy consumption and lower their associated energy costs.

Figure 5:
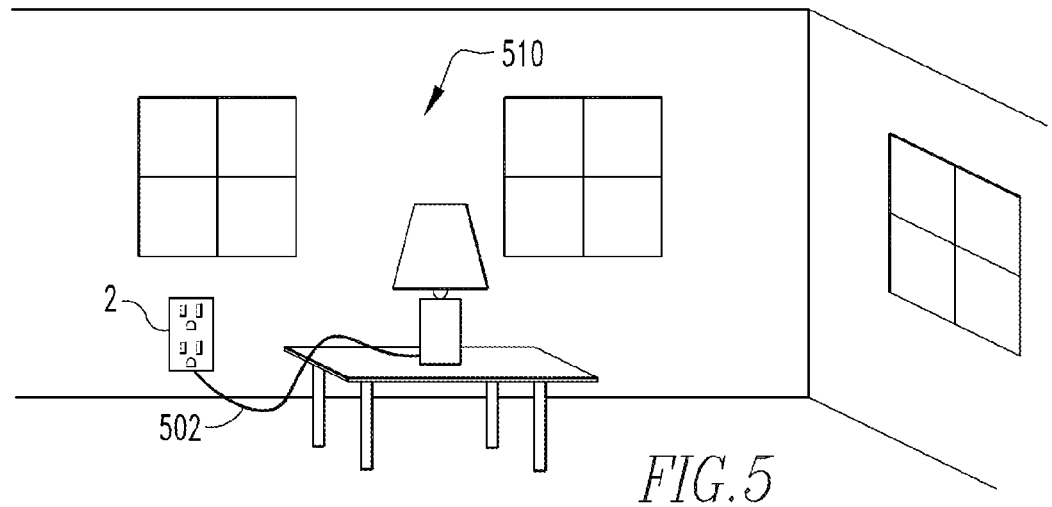
FIG. 5 is an illustrative diagram of a system using the mountable wall receptacle of FIG. 1 within a household, in accordance with another embodiment of the disclosed concept.

FIG. 5 is an illustrative diagram of a system using mountable wall receptacle 2 within a residence 500, in accordance with another embodiment of the disclosed concept. Residence 500, in one embodiment, includes an accessory device 510, which receives power to operate from wall receptacle 2. In the illustrated embodiment, front view 300 of wall receptacle 2 is provided. Accessory device 510 receives power, such as AC power, from wall receptacle 2 via a power cord 502. In one embodiment, an additional user device, such as user device 420 of FIG. 4, is capable of monitoring an amount of power provided to accessory device 510 via one or more power-lines 430 connected to power-line communications circuitry 102 of wall receptacle 2.

In the illustrated, non-limiting embodiment, wall receptacle 2 includes cover plate 114 having display screen 302, 304. Display screen 302, 304 presents the amount of power provided to accessory device 510 thereon. For example, if accessory device 510 has used 5 kW/hrs of power, display screen 302 of wall receptacle 2 would display "5 kW/hrs." In this way, an individual of residence 500 can view how much energy a particular accessory device is using, and augment their usage of that device to better control the costs, both economically and in terms of energy consumption, that accessory device 510 takes up. This can be extremely beneficial for individuals as the costs associated each unit of energy provided to a device continues to increase.

Figure 6:
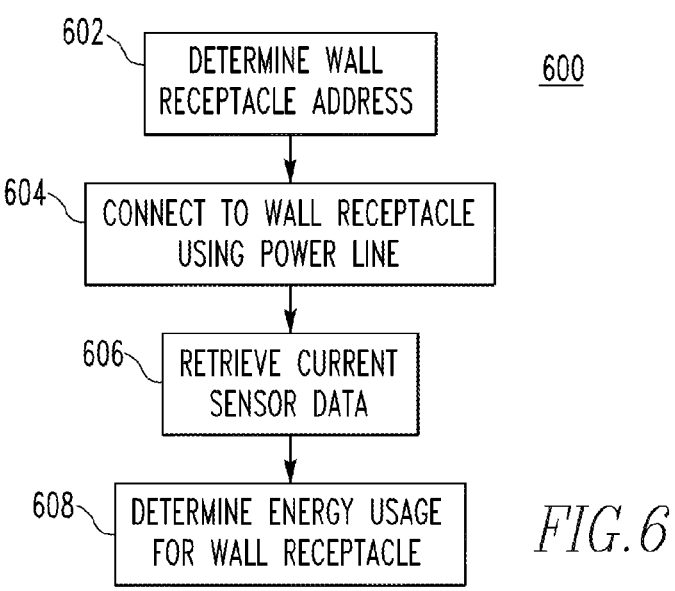
FIG. 6 is an illustrative flowchart of a process for monitoring energy output of the wall receptacle of FIG. 1 using power-line communications, in accordance with additional non-limiting example embodiments of the disclosed concept.

FIG. 6 is an illustrative flowchart of a process 600 for monitoring energy output of wall receptacle 602 using power-line communications functionality, in accordance with additional non-limiting example embodiments of the disclosed concept. Process 600 begins, in one embodiment, at step 602. At step 602, an address of wall receptacle 2 is determined. Each wall receptacle 2 including power-line communications circuitry 102 has an address, or unique identifier, associated with it. This address indicates to power-line communications interfaces how that particular wall receptacle is able to be communicated with. Similarly to a telephone number or IP address, the address of a particular power-line communications circuitry 102 indicates how a particular end point is to communicate therewith.

After the address of wall receptacle 2, and in particular power-line communications circuitry 102 thereon, is determined, a user device, such as user device 420 of FIG. 4, is capable of connecting to wall receptacle 2 at step 604. In one embodiment, wall receptacle 2 is connected to using power-lines 430. For example, a residence or building where wall receptacle 2 is installed may have a pre-existing power-line architecture. In this way, user device 420, for instance, can connect to wall receptacle 2 across power-lines 430.

At step 606, current sensor data is retrieved from current sensor 104 using power-line communications circuitry 102. In one embodiment, user device 420 is capable of retrieving readings from current sensor 104 by accessing wall receptacle 2 using power-lines 430. In another embodiment, current sensor data, corresponding to an amount of current provided to an accessory device plugged into outlet 306, 308, is stored in memory within wall receptacle 2, such as memory 202. For example, memory 202 may store a cumulative amount of current provided to outlets 306 and/or 308, an amount of current provided to outlets 306 and/or 308 for a predefined time period, or any other data captured by current sensor 104. In this scenario, any of these data values is obtainable by an individual using user device 420 by accessing wall receptacle 2 across power-lines 430.

At step 608, an amount of energy usage for wall receptacle 2 is determined. As mentioned above, current sensor 104 monitors an amount of current provided to one or more of outlets 306 and 308. Current sensor 104, in one embodiments, captures the value for the amount of current provided in a first data format, such as a binary format. This value can be difficult for many people to comprehend. Thus, user device 420, in the exemplary embodiment, includes a power-line communications interface thereon which is capable of converting the captured current sensor data from step 606 into a user-friendly and readable format. For example, the power-lines communication interface on user device 420 may convert the binary current sensor data into an amount of energy provided to a specific outlet, such as kW/hrs. As another example, the power-lines communications interface may convert the binary current sensor data, or the converted kW/hr current sensor data, into a monetary value of the amount of energy that has been consumed by a corresponding outlet of wall receptacle 2. In this way, individuals are better able to monitor the costs associated with using certain accessory devices, in order to minimize energy waste and financial expenditure. In one embodiment, wall receptacle 2 includes such conversion techniques thereon such that wall receptacle 2 is capable of directly outputting a user-friendly and readable output value of the amount of energy consumed by a particular accessory device connected to wall receptacle 2. For instance, this value may then be provided to display 302, 304 such that an individual can see directly on cover plate 114 the amount of energy consumed by accessory device 420 connected thereto.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A mountable wall receptacle comprising:
a cover plate comprising at least one set of openings for an outlet;
a display screen located on a portion of the cover plate;
an upper mount located at an upper portion of the cover plate for securing the wall receptacle to a wall;
a lower mount located at a lower portion of the cover plate for further securing the wall receptacle to the wall;
a housing coupled to an inner portion of the cover plate such that the housing is received within an opening of the wall;
a current sensing device located within the housing, the current sensing device comprising:
an internal contact for the outlet, wherein a plug for an accessory device is received by the outlet such that the internal contact is in electrical communication with the accessory device;
a current sensor coupled to the internal contact such that the current sensor monitors an amount of energy provided to the internal contact for the accessory device;
a power source coupled to the current sensor and the internal contact, the power source being operable to provide energy to the accessory device;
power-line communications circuitry that is in electrical communication with at least the current sensor;
memory that stores instructions for converting the amount of energy into a readable format for the display screen; and
at least one processor operable to cause an output corresponding to the readable format of the amount of energy to be displayed by the display screen;
an additional display screen located on an additional portion of the cover plate, wherein the at least one set of openings further comprises a first set of openings corresponding to the outlet and a second set of openings corresponding to an additional outlet, the current sensing device further comprising:
an additional internal contact for the additional outlet, wherein an additional plug for an additional accessory device is received by the additional outlet such that the internal contact is further in electrical communication with the additional accessory device, and wherein:
the current sensor is further coupled to the internal contact and the additional internal contact such that the current sensor monitors the amount of energy provided to the internal contact for the device as well an additional amount of energy provided to the additional accessory device;
the power line communications circuitry is further operable to:
retrieve the additional amount of energy provided from the current sensor; and
provide the additional amount of energy to the power-line communications interface for further monitoring of energy usage;
the instructions are further being capable of converting the additional amount of energy into an additional readable format for the additional display screen; and
the at least one processor is further operable to cause an additional output corresponding to the additional readable format of the additional amount of energy to be displayed by the additional display screen.

2. The mountable wall receptacle of claim 1, wherein the memory further stores the amount of energy, wherein the at least one processor is further operable to:
- generate the readable format of the stored amount of energy; and
- communicate the readable format to the power-line communications circuitry.

3. The mountable wall receptacle of claim 1, wherein the current sensor comprises one of a Hall Effect sensor and a current transformer.

4. The mountable wall receptacle of claim 1, wherein:
- the at least one set of openings comprises two contact openings and a ground openings;
- the internal contact comprises two contact portions and a ground portion; and
- the plug electrically connects to the two contact portions and the ground portion via the two contact openings and the ground openings, respectively, when the plug is received by the outlet.

5. The mountable wall receptacle of claim 1, wherein the power-line communications circuitry has a unique address that enables the current sensing device of the mountable wall receptacle to be accessed using at least one power-line, the at least one power-line being coupled to the current sensing device.

* * * * *